(12) United States Patent
Zhu et al.

(10) Patent No.: US 12,101,927 B2
(45) Date of Patent: Sep. 24, 2024

(54) SEMICONDUCTOR STRUCTURE AND METHOD OF FORMING THE SAME, MEMORY AND METHOD OF FORMING THE SAME

(71) Applicant: CHANGXIN MEMORY TECHNOLOGIES, INC., Hefei (CN)

(72) Inventors: Yiming Zhu, Hefei (CN); Er-Xuan Ping, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 498 days.

(21) Appl. No.: 17/430,184

(22) PCT Filed: Nov. 11, 2020

(86) PCT No.: PCT/CN2020/128131
§ 371 (c)(1),
(2) Date: Aug. 11, 2021

(87) PCT Pub. No.: WO2021/218112
PCT Pub. Date: Nov. 4, 2021

(65) Prior Publication Data
US 2022/0310625 A1  Sep. 29, 2022

(30) Foreign Application Priority Data
Apr. 27, 2020  (CN) .................. 202010343497.2

(51) Int. Cl.
*H10B 12/00* (2023.01)
*H01L 21/8234* (2006.01)
*H10B 61/00* (2023.01)

(52) U.S. Cl.
CPC ... *H10B 12/482* (2023.02); *H01L 21/823487* (2013.01); *H10B 12/395* (2023.02); *H10B 61/22* (2023.02)

(58) Field of Classification Search
CPC .... H10B 12/482; H10B 12/395; H10B 61/22; H10B 53/30; H10B 12/05; H10B 12/0335;
(Continued)

(56) References Cited

U.S. PATENT DOCUMENTS 10,134,739 B1   11/2018  Zang
2010/0096691 A1  4/2010  Shin et al.
(Continued)

FOREIGN PATENT DOCUMENTS

CN         102468181 B    3/2016
CN         109285838 A    1/2019
(Continued)

OTHER PUBLICATIONS

Supplementary European Search Report in the European application No. 20934120.5, mailed on Sep. 28, 2023. 8 pages.
(Continued)

*Primary Examiner* — David Vu
(74) *Attorney, Agent, or Firm* — Kilpatrick Townsend & Stockton LLP

(57) ABSTRACT

The present invention relates to a semiconductor structure and its forming method, and a memory and its forming method. The semiconductor structure includes a substrate, a vertical transistor on the substrate, and a bit line connected to the bottom of the vertical transistor and disposed between the bottom of the vertical transistor and the substrate. The vertical transistor in such a semiconductor structure has a relatively small plane dimension.

11 Claims, 10 Drawing Sheets

(58) Field of Classification Search
CPC ...... H10B 12/315; H10B 12/02; H10B 12/30; H10B 63/34; H01L 21/823487; H01L 27/088; H01L 21/8234; H10N 59/00
See application file for complete search history.

(56) References Cited

U.S. PATENT DOCUMENTS

| | | | |
|---|---|---|---|
| 2013/0193400 A1* | 8/2013 | Sandhu | H10B 63/80 257/5 |
| 2019/0035791 A1 | 1/2019 | Zang | |
| 2019/0074363 A1 | 3/2019 | Zhu | |
| 2021/0335789 A1 | 10/2021 | Zhu | |
| 2023/0110504 A1 | 4/2023 | Huilong | |

FOREIGN PATENT DOCUMENTS

| | | |
|---|---|---|
| CN | 109461738 A | 3/2019 |
| CN | 109461756 A | 3/2019 |
| CN | 110383476 A | 10/2019 |
| CN | 110896074 A | 3/2020 |
| CN | 211719592 U | 10/2020 |
| WO | 2020042255 A1 | 3/2020 |

OTHER PUBLICATIONS

ISR for International Application PCT/CN2020/128131 Issued Jan. 8, 2021.
English translation of Written Opinion of the International Search Authority in the international application No. PCT/CN2020/128131, mailed on Jan. 26, 2021.

\* cited by examiner

SEMICONDUCTOR STRUCTURE AND METHOD OF FORMING THE SAME, MEMORY AND METHOD OF FORMING THE SAME

CROSS-REFERENCE TO RELATED APPLICATIONS

The present application is a national phase entry of International Patent Application No. PCT/CN2020/128131, filed on Nov. 11, 2020, which claims priority to the Chinese Patent Application No. 202010343497.2, filed on Apr. 27, 2020. The entire contents of the aforementioned patent applications are herein incorporated by reference.

TECHNICAL FIELD

The present invention relates to the technical field of semiconductors, and particularly to a semiconductor structure and its forming method, and a memory and its forming method.

BACKGROUND

The currently existing memory usually includes a data storage cell and a control transistor that controls the data storage cell. The integration level of the transistor restricts the storage density of the memory. With regard to the planar transistor, the dimension of the transistor is reduced in the prior art by reducing the size of the transistor channel, so as to enhance the storage density of the memory.

However, with reduction in the size of the transistor channel, narrow-channel effect and short-channel effect lead to degradation of the transistor performance, whereby the performance of the memory is adversely affected, and further enhancement of the transistor dimension and storage density of the memory is restricted.

It is a task to be urgently dealt with in the state of the art as how to reduce the planar dimension of the transistor and enhance the storage density of the memory without degrading the transistor performance.

SUMMARY

The technical problem to be solved by the present invention is to provide a semiconductor structure and its forming method, and a memory and its forming method to further enhance the storage density of the memory.

In order to solve the above problem, the present invention proposes a semiconductor structure that comprises a substrate; a vertical transistor on the substrate; and a bit line connected to the bottom of the vertical transistor, and disposed between the bottom of the vertical transistor and the substrate.

In one of the embodiments, the vertical transistor comprises, sequentially in the direction upward from the substrate, a first doping area, a channel area, a second doping area, and a gate structure disposed to surround the channel area.

In one of the embodiments, a plurality of the vertical transistors is formed on the substrate and distributed in an array along a first direction and a second direction, the first doping areas on the bottoms of the vertical transistors arranged on the same straight line along the first direction are connected to the same bit line, and the gate structures of the vertical transistors arranged on the same straight line along the second direction are connected to one another.

In one of the embodiments, the structure further comprises a separation layer formed between every two vertical transistors on the substrate, and the separation layer comprises at least one insulating medium layer.

In one of the embodiments, the structure further comprises a bit-line connection line, whose bottom is connected to the bit line.

In one of the embodiments, the first doping area, the channel area, and the second doping area of the vertical transistor are disposed in a same and single active pillar; alternatively, the channel area and the second doping area of the vertical transistor are formed in an epitaxial semiconductor pillar on the first doping area.

In one of the embodiments, doped ions in the first doping area and/or the second doping area are formed by diffusion or ion implantation.

In one of the embodiments, the bit-line connection line and the bit line are formed in the same and single processing step.

In one of the embodiments, the plural bit-line connection lines are respectively disposed on end portions of the plural bit lines in a one-by-one manner, and the bit-line connection lines are distributed at intervals at the end portions of the bit lines.

The technical solution of the present invention further provides a method of forming a semiconductor structure, which method includes the steps of providing a substrate, on which are formed a sacrificial layer and an active layer on the sacrificial layer; patterning the active layer, forming an opening that exposes the sacrificial layer; removing the sacrificial layer by means of the opening; and forming a bit line at partial position of the sacrificial layer.

In one of the embodiments, the method includes patterning the active layer to form the active pillar, and forming the bit line between the bottom of the active pillar and the substrate.

In one of the embodiments, the method further includes forming a first doping area, a channel area and a second doping area sequentially upward from the bottom of the active pillar, and forming a gate structure that surrounds the channel area.

In one of the embodiments, the method of forming the first doping area, the channel area and the second doping area includes employing in situ doping technique to dope the active layer in the process of forming the active layer by employing epitaxial growth technique, and to sequentially form a first doping layer, a channel doping layer and a second doping layer; and, after patterning the active layer to form the active pillar, respectively patterning the first doping layer, the channel doping layer and the second doping layer as the first doping area, the channel area and the second doping area disposed sequentially upward from the bottom of the active pillar.

In one of the embodiments, the method of forming the first doping area includes, after forming the active pillars, forming a transition layer having doping elements on the substrate between adjacent active pillars; and diffusing, by a diffusion process, at least partial doping elements in the transition layer into the active pillar to form the first doping area.

In one of the embodiments, the method of forming the first doping area and the second doping area includes conducting ion implantation at the bottom portion of the active pillar to form the first doping area disposed at the bottom of the active pillar; and conducting ion implantation at the top portion of the active pillar to form the second doping area disposed at the top of the active pillar.

In one of the embodiments, the method further includes patterning the active layer to form the active pillar, the method of forming the bit line between the bottom of the active pillar and the substrate further includes etching the active layer and the sacrificial layer to form active lines extending along a first direction; forming a first separation layer that fills the space between the active lines; patterning the active lines to form plural active pillars and plural openings, which openings expose the sacrificial layer; removing the sacrificial layer by means of the openings, and forming space between the bottom of the active pillar and the substrate; and filling conductive material in the space, and forming the bit line extending along the first direction.

In one of the embodiments, the method further includes patterning the active layer to form the active pillar; the method of forming the bit line between the bottom of the active pillar and the substrate further includes etching the active layer and the sacrificial layer to form active lines extending along a first direction; forming a first separation layer that fills the space between the active lines; patterning the first separation layer, forming plural openings in the first separation layer, which openings expose the sacrificial layer; removing the sacrificial layer by means of the openings, and forming space between the bottom of the active line and the substrate; filling conductive material in the space, and forming the bit line extending along the first direction; and patterning the active lines, and forming active pillars extending in an array along the first direction and second direction.

In one of the embodiments, the method further includes forming an opening at the end portion of the active line; and filling conductive material in the opening to form a bit-line connection line, whose bottom is connected to the bit line.

In one of the embodiments, the bit-line connection line and the bit line are formed in the same and single processing step.

In one of the embodiments, the method further includes back-etching the first separation layer to expose the active pillar of a partial height; sequentially forming a gate medium layer and a gate electrode layer on the back-etched, exposed active pillar; and patterning the gate medium layer and the gate electrode layer to form a gate structure that surrounds the channel area of the active pillar, and to expose the top portion of the active pillar.

The technical solution of the present invention also provides a memory that comprises the aforementioned semiconductor structure, and a storage cell disposed above the vertical transistor and electrically connected to the top of the vertical transistor.

In one of the embodiments, the storage cell includes anyone of a capacitive storage cell, a magnetic storage cell, a ferroelectric storage cell, a phase-changing storage cell, or a resistive storage cell.

The technical solution of the present invention further provides a method of forming a memory, which method includes providing the aforementioned semiconductor structure, and forming a storage cell above the vertical transistor, the storage cell being electrically connected to the top of the vertical transistor.

In one of the embodiments, the storage cell includes anyone of a capacitive storage cell, a magnetic storage cell, a ferroelectric storage cell, a phase-changing storage cell, or a resistive storage cell.

The method of forming a semiconductor structure according to the present invention forms a sacrificial layer on the substrate and an active layer disposed on the sacrificial layer, whereby a bit line is used in place of the position of the sacrificial layer, so as to form an embedded bit line, thus facilitating subsequent formation of the vertical transistor, and lead-out of the source/drain electrode from the bottom of the vertical transistor by means of the bit line.

Further, the chip area occupied by the vertical transistor is relatively small, and the length of the channel is decided by the thickness of the active layer, so that it is made by possible to reduce the area of the transistor without reducing the length of the channel, and to hence enhance the integration level of the semiconductor structure.

Furthermore, it is made possible, by forming a plurality of openings to remove the sacrificial layer by means of the plurality of openings, to enhance the efficiency for removing the sacrificial layer, to avoid residue of the sacrificial layer, and to therefore enhance the quality of the bit line as formed.

The memory according to the present invention includes the semiconductor structure having a vertical transistor array, whereby the storage density of the memory is enhanced in the case of relatively small dimension of the transistor.

DESCRIPTION OF EMBODIMENTS

Detailed explanations are made below to some embodiments of the semiconductor structure and its forming method, the memory and its forming method as provided by the present invention in combination with the accompanying drawings.

Refer to FIGS. 1 through 13C, which are schematic diagrams illustrating the process of forming the semiconductor according to an embodiment of the present invention.

Figure 1:
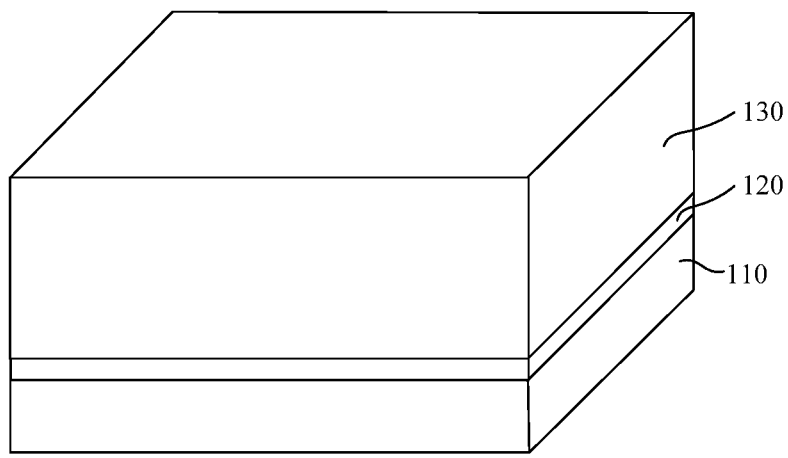
FIGS. 1 through 13C are schematic diagrams illustrating the process of forming the semiconductor according to an embodiment of the present invention.

Referring to FIG. 1, a substrate 110 is provided, a sacrificial layer 120 is formed on the substrate 110, and an active layer 130 is formed on the sacrificial layer 120.

The substrate 110 can be of such various semiconductor materials as Si, Ge, and SiC, etc., and can be either of a single-layered structure or a composite structure, to which no restriction is made in this context.

It is possible to sequentially form the sacrificial layer 120 and the active layer 130 on the substrate 110 by a deposition technique or other technique. The active layer 130 can be of one or more of such semiconductor materials as Si, Ge, or SiC, for instance. The sacrificial layer 120 is of a material different from the materials of the substrate 110 and the active layer 130, so that the substrate 110 and the active layer 130 are affected less in the subsequent process of removing the sacrificial layer 120.

In the present embodiment, the substrate 110 is a silicon substrate, the sacrificial layer 120 is a SiGe layer, and the active layer is a silicon layer. By employment of the epitaxial growth technique, after the sacrificial layer 120 is epitaxially formed on the substrate 110, the active layer 130 is further formed on the sacrificial layer 120 also by epitaxial technique.

In fact, as long as the material of the sacrificial layer 120 is different from the material(s) of the substrate 110 and the active layer 130, it suffices to remove the sacrificial layer 120 by virtue of etching selectivity ratio of the sacrificial layer 120 as different from that/those of the substrate 110 and the active layer 130.

In some embodiments, the substrate 110, the sacrificial layer 120 and the active layer 130 can be of SOI structure, in which the buried oxide layer serves as the sacrificial layer 120.

In some embodiments, ion implantation can be conducted on a bulk silicon substrate to form a doping layer inside the bulk silicon substrate to serve as the sacrificial layer 120. For example, Ge implantation can be performed on bulk silicon to form an SiGe layer inside the bulk silicon by controlling Ge implantation depth to serve as the sacrificial layer 120, the silicon layer below the doping layer serves as the substrate 110, and the silicon layer above the doping layer serves as the active layer. In other embodiments, such other elements as C, 0, N etc. can also be implanted to form the doping layer; the sacrificial layer 120 is formed by making the etching rate of the doping layer different from those of the material layers both above and below it. Preferably, the material of the sacrificial layer 120 can be silicon oxide, silicon nitride, silicon oxynitride, and silicon oxycarbide, etc.

The active layer 130 is employed to form a vertical transistor, while the sacrificial layer 120 is employed to be subsequently replaced to form a bit line. The thicknesses of the sacrificial layer 120 and the active layer 130 are reasonably set in accordance with the size of the vertical transistor to be formed and the size of the bit line. In some embodiments, the thickness of the sacrificial layer 120 can be in the range 35 nm~50 nm, and the thickness of the active layer 130 can be in the range 100 nm~1000 nm.

Figure 2:
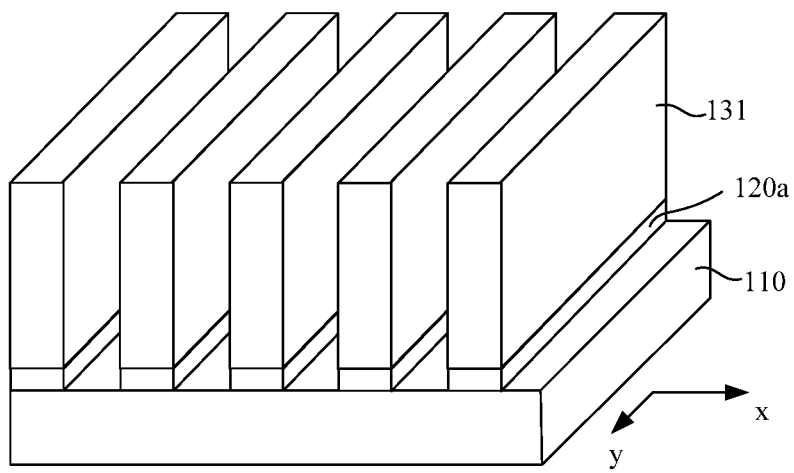

Referring to FIG. 2, the active layer 130 and the sacrificial layer 120 are etched onto the substrate 110 to form plural active lines 131 arranged in parallel and extending along a first direction.

In this embodiment, the method of forming the active line 131 further includes forming a patterned mask layer (not shown in this figure) on the active layer 130, which patterned mask layer has an opening pattern extending along the first direction; using the patterned mask layer as mask to etch the active layer 130 and the sacrificial layer 120 to form bar-shaped active lines 131 and bar-shaped sacrificial layers 120a.

In this embodiment, the first direction is direction y. The active layer 130 and the sacrificial layer 120 are etched by dry etching technique, and corresponding etching gases are selected at corresponding etching phases.

Figure 3:
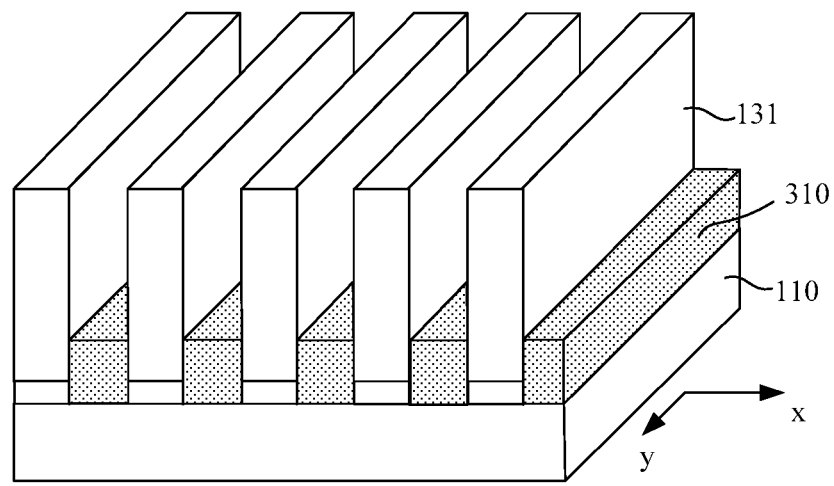

Referring to FIG. 3, transition layers 310 having doping elements are formed on the substrate 110 between adjacent active lines 131.

It is possible to perform back-etching after the transition layer material is deposited on the substrate 110 to form the transition layer 310 of a certain thickness. The thickness of the transition layer 310 can be adjusted in accordance with the size of the source/drain area of the transistor to be formed.

The material of the transition layer 310 can be different from the material of the active line 131, as the material can be one that facilitates diffusion of impurities, such as polysilicon, and can also be such other medium materials as silicon oxide, silicon nitride, and silicon oxynitride, etc.

The method of forming the transition layer 310 having doping elements includes, after the transition layer 310 having a certain thickness and having not yet been doped is formed on the substrate 110, doping the transition layer 310 by means of ion implantation. At the same time, a patterned mask layer is covered on the top of the active line 131, and ion implantation is so controlled as to perform doping only on the transition layer 310 by controlling the energy of the ion implantation. In accordance with the type of the transistor to be formed, N-type or P-type ions or atomic clusters with N-type or P-type ions are implanted into the transition layer 310. The doping elements in the transition layer 310 may exist in the form of ions, atoms, chemical modulators or clusters.

In other embodiments, it is also possible, in the process of forming the transition layer 310, to directly form the transition layer 310 having doping elements by employing in situ doping technique to add a doping gas having doping elements in the depositing gas.

Figure 4:
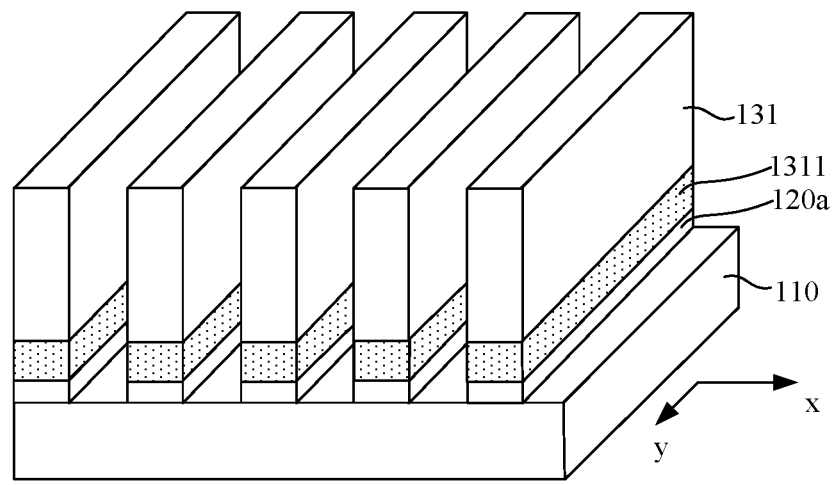

Referring to FIG. 4, by means of a diffusion process, at least partial doping elements in the transition layer 310 having doping atoms are diffused into the active line 131 to form a first doping area 1311.

The diffusion process can be a thermal annealing process, and the annealing process with proper parameters is so selected according to the diffusion efficiency of the doping atoms, that doping elements in the transition layer 310 are diffused into the active line 131 to form the first doping area 1311 that corresponds to the thickness of the transition layer 310.

The doping concentration in the first doping area 1311 formed after the diffusion process can be adjusted by adjusting such parameters as the concentration, diffusion processing time and temperature of the doping elements in the transition layer 310.

In other embodiments, it is also possible to form the first doping area 1311 by directly performing doping ion implantation on the active line 131 after the patterned mask layer is removed from the top of the active line 131; specifically, the first doping area 1311 is formed at the bottom of the active line 131 by controlling the energy and direction of ion implantation during the ion implantation process, and adjusting the implantation depth.

In other embodiments, it is also possible to form the first doping area at the bottom of the active line or active pillar by ion implantation in other, subsequent steps, for instance, in the subsequent step of patterning the active line to further form the active pillar, or other steps.

In other embodiments, it is also possible to employ in situ doping technique to dope the active layer during the process of forming the active layer by the technique of epitaxial deposition, so as to form the first doping area disposed at the bottom of the active layer; after the active layer is patterned, the first doping area is formed at the bottom of the active line or active pillar.

Figure 5:
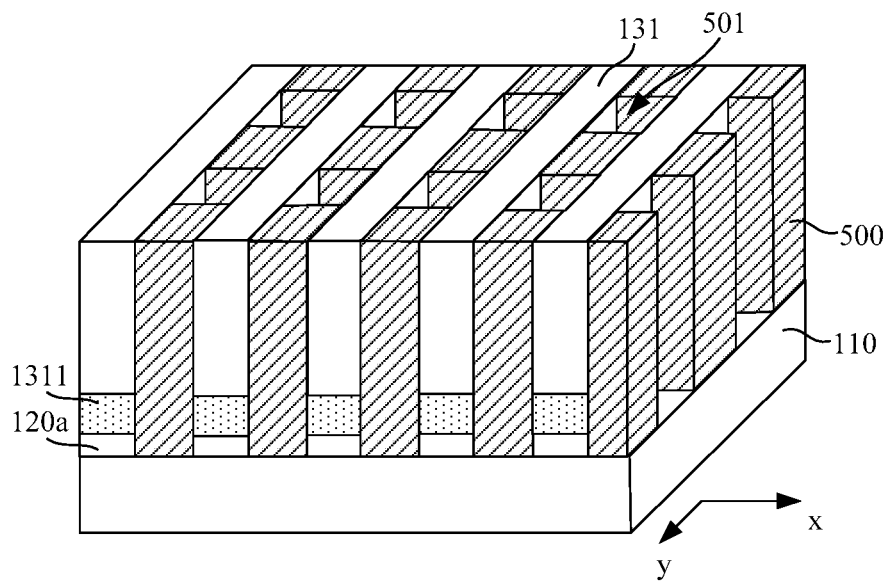

Referring to FIG. 5, first separation layers 500 are formed on the substrate 110 to fill the space between every two active lines 131; the first separation layer 500 is patterned, and plural openings 501, which expose the sacrificial layers 120a, are formed in the first separation layers 500 between adjacent active lines 131.

The material of the first separation layer 500 is different from the material of the sacrificial layer 120a, and the material of the first separation layer 500 is an insulating material to provide electrical insulation amongst the various active lines 131. In this embodiment, the material of the first separation layer 500 is silicon oxide. In this embodiment, the method of forming the first separation layer 500 is chemical vapor deposition technique, whereby, after the space between adjacent active lines 131 on the substrate 110 is filled and the separation material layer is covered at the top of the active lines 131, the separation material layer is planarized to form the first separation layer 500. In this embodiment, the top of the first separation layer 500 is flush with the top of the active line 131. In other embodiments, the top of the active line 131 is still left with the patterned mask layer used to pattern the active layer to form the active line, and the first separation layer 500 is flush with the patterned mask layer. In other embodiments, before the first separation layer 500 is formed, the patterned mask layer has already been removed, the first separation layer 500 also covers the top of the active line, making it possible to protect the top of the active line 131 in the subsequent process.

After the separation layer 500 is formed, the separation layer 500 is etched to form the opening 501. The sidewall of the opening 501 exposes the active line 131 and the sidewall of the sacrificial layer 120a. Two or more openings 501 are formed between every two adjacent active lines 131a. Specifically, the bottom of the opening 501 can expose the substrate 110, and can also be disposed in the sacrificial layer 120a, as long as the bottom of the opening 501 at least exposes partial sidewall of the sacrificial layer 120a.

In other embodiments, the opening 501 does not expose the sidewall of the active line 131, for instance, the size of the opening 501 along the direction spacing the active lines 131 is less than the length of the space between the active lines 131, thus functioning to protect the active lines. Preferably, the separation layer 500 is a multilayered medium layer. For example, it is a composite layer with silicon oxide and silicon nitride, the silicon oxide is formed on the surface of the active lines 131, the silicon nitride fills the remaining space between the active lines 131, and the opening 501 is formed in the silicon nitride. The silicon oxide serves to protect the active lines 131.

In other embodiments, the openings are also formed on the end portions of the active lines at the same side, or the openings are formed on the end portions of the active lines at the two sides; moreover, the openings are formed on only one end portion of each active line, and the openings on the end portions at the same side are distributed at intervals, so as to reduce the density of the openings at local regions, and to enlarge the process window. During subsequent filling of conductive material to form the bit line, bit-line connection lines can be simultaneously formed in the openings at the end portion, and the bit-line connection lines are formed in the same and single processing step as the bit line, thus saving processing cost.

Figure 6:
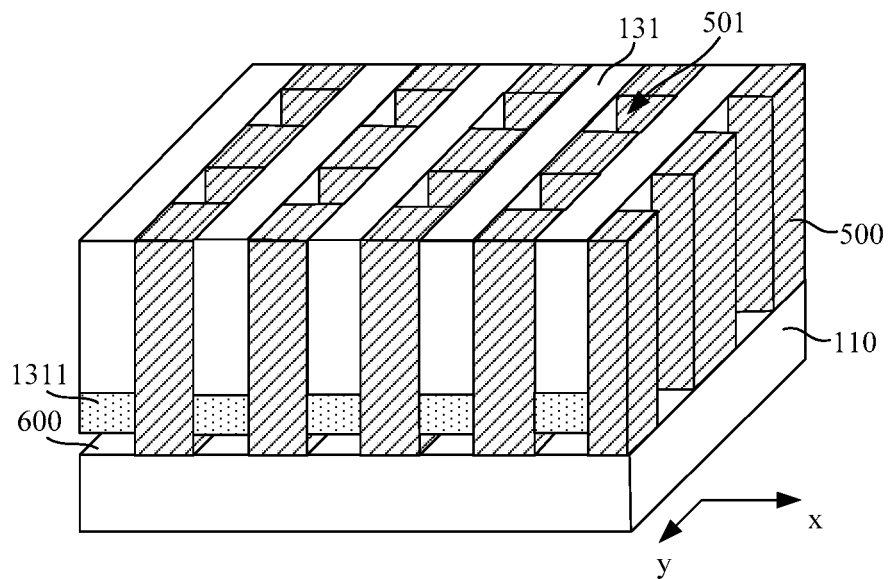

Referring to FIG. 6, the sacrificial layer 120a is removed along the opening 501, and space 600 is formed between the bottom of the active line 131 and the substrate 110.

Wet etching technique is employed to remove the sacrificial layer 120a. Persons skilled in the art may so select a proper etching solution according to the material of the sacrificial layer 120a, that the sacrificial layer 120a has a etching selectivity ratio higher than those of the active line 131 and the first separation layer 500 during the process of wet etching, whereby the active line 131 and the first separation layer 500 are less affected in the process of removing the sacrificial layer 120a.

After the sacrificial layer 120a is removed, the active line 131 is supported by the first separation layer 500, hanging above the substrate 110, and forming the space 600 in between the substrate 110.

Figure 7A:
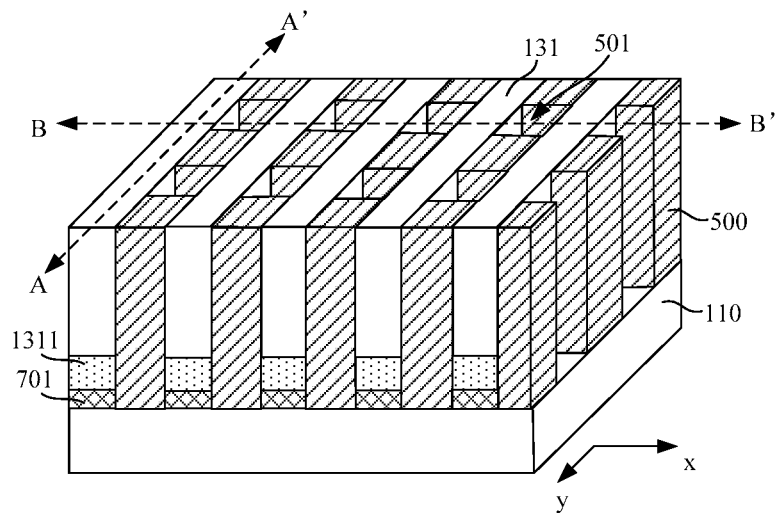
Figure 7B:
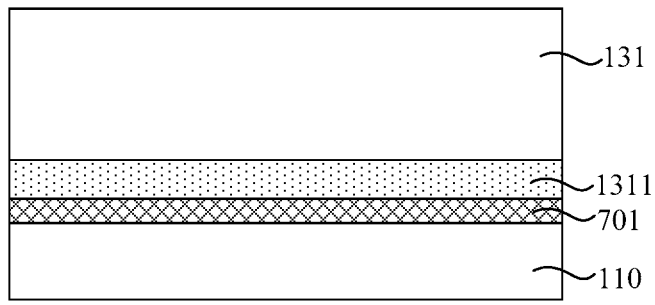
Figure 7C:
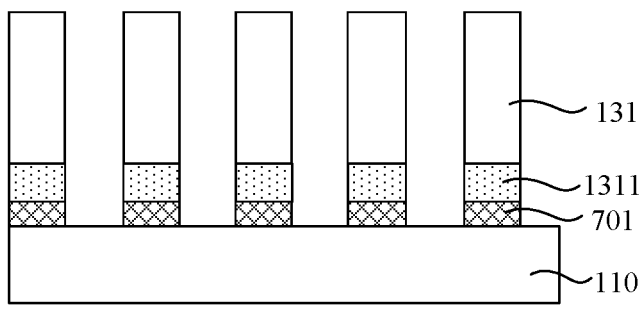

Referring to FIGS. 7A~7C, a conductive material is filled in the space 600 to form bit line 701 extending along the first direction; FIG. 7B is a diagram cut along secant line A-A' in FIG. 7A, and FIG. 7C is a diagram cut along secant line B-B' in FIG. 7A.

The conductive material can be deposited in the space 600 by such technique as atomic layer deposition or chemical vapor deposition or physical vapor deposition, and is of polysilicon or such a metal material as W, Co, Ag or Al, etc. The conductive material can also be a multilayered material, for example, a composite of TiN with W.

The conductive material fills the space 600 to form the bit line 701 disposed at the bottom of the active line 131; the conductive material also fills the opening 501 and covers the first separation layer 500 and the top of the active line 131; the conductive material is subsequently removed by back-etching or planarization process from the top of the first separation layer 500 and from the top of the active line 131, and the conductive material is removed by etching process from the opening 501, thus preventing the bit lines 701 at the bottoms of adjacent active lines 131 from interconnecting with each other. It is also possible to form the bit line 701 in the space 600 by selective growth technique.

Figure 8A:
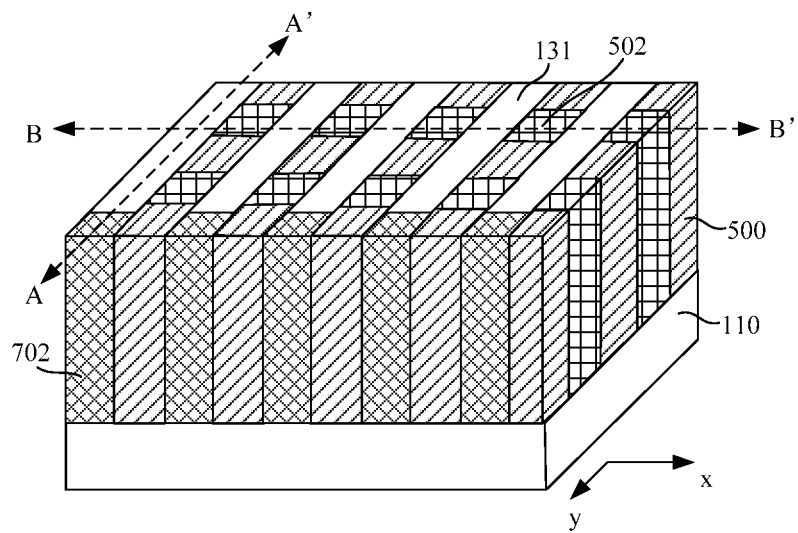
Figure 8B:
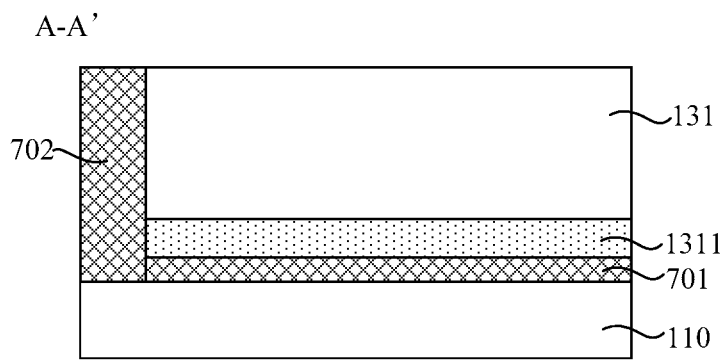
Figure 8C:
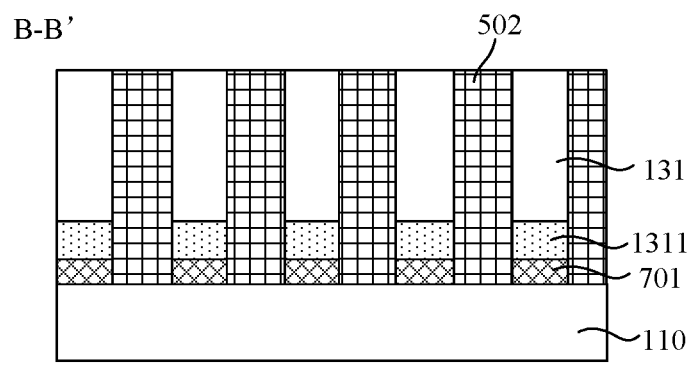

Referring to FIGS. 8A~8C, bit-line connection line 702 is formed at the end portion of the active line 131, and the bottom of the bit-line connection line 702 is connected to the bit line 701. FIG. 8B is a diagram cut along secant line A-A' in FIG. 8A, and FIG. 8C is a diagram cut along secant line B-B' in FIG. 8A.

Specifically, an opening is formed at the end portion of the active line 131 to expose the bit line 701, and a conductive material is filled in the opening to form the bit-line connection line 702. Before the opening is formed by etching, an insulating medium material is filled in the opening 501 (see FIG. 7A), and planarization is performed to form separation medium layer 502. The surface of the separation medium layer 502 is flush with the surface of the first separation layer 500 or covers the first separation layer 500 and the top of the active line 131. The separation medium layer 502 is employed to provide electrical separation among adjacent active lines 131, and to provide a plane surface, so as to form the mask layer used to etch the active line 131.

In other embodiments, the separation medium layer 502 can be dispensed with, whereas a plane surface is formed during the process of etching the active line 131 by filling the opening 501 with the material of the mask layer, for instance, a bottom anti-reflection layer.

In this embodiment, the opening is formed at the end portion of the active line 131. In other embodiments, it is also possible to form the opening at other positions of the active line 131.

In other embodiments, the opening 501 is also formed at the end portion of the active line 131; during the process of forming the bit line 701, after the conductive material is filled in the opening 501, a mask layer is formed on the opening 501 at the end portion, the mask layer is used to prevent the conductive material in the opening 501 at the end portion of the active line 131 from being removed when the conductive material in the opening 501 is etched and removed, and the conductive material remaining in the opening 501 at the end portion of the active line 131 is used to from the bit-line connection line 702.

The bottom of the bit-line connection line 702 is connected to the bit line 701 for leading out the bit line 701 embedded below the active line 131, so as to facilitate sending control signals to the bit line 701. The bit line 701 is located below the active line 131, is electrically connected to the first doping area 1311 at the bottom of the active line 131, and extends along the extending direction of the active line 131.

Figure 9:
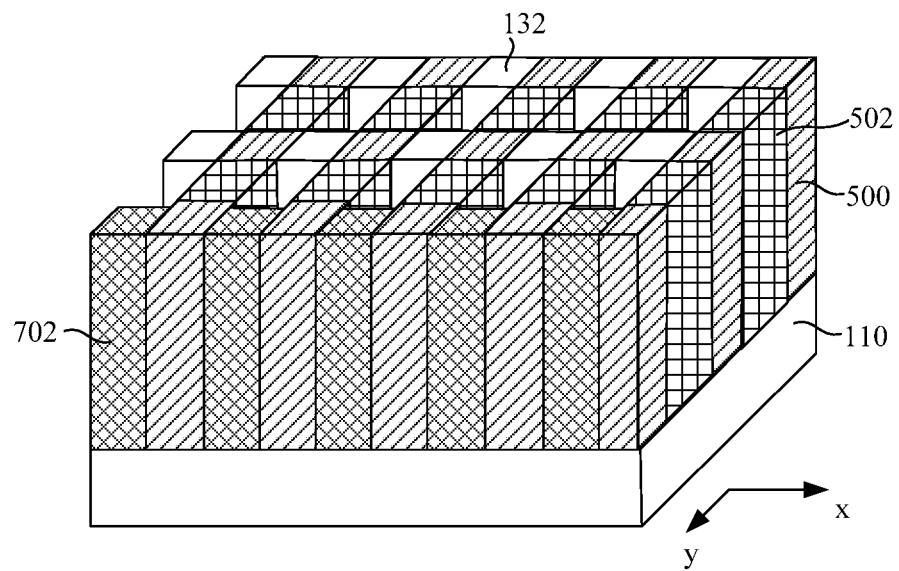

Referring to FIG. 9, the active line 131 is patterned (refer to FIG. 8A) to form plural separate active pillars 132.

The active line 131 is patterned via selective etching technique to form the active pillars 132. The active pillars 132 are arranged in arrays along first direction (direction y) and second direction (direction x). In this embodiment, the first direction and the second direction form an angle of 90°. In other embodiments, the included angle between the first direction and the second direction is in the range 60°~90°.

In other embodiments, after the active pillars 132 are formed, it is possible to perform ion implantation on the active pillars to form a channel area and a second doping area above the channel area.

In this embodiment, after the active pillars 132 are formed, the channel area is formed above the first doping area 1311 at the bottom of the active pillars 132 merely through ion implantation, the doping concentration inside the channel area is adjusted via ion implantation to adjust the threshold voltage of the transistor as formed, either P-type or N-type doping can be conducted in the channel area, and proper doping type and doping concentration are selected as demanded by the threshold voltage. In other embodiments, it is also possible to not perform doping on the channel area.

In other embodiments, during the aforementioned process of forming the active layer 130 (refer to FIG. 1), it is also possible to form a doping channel layer in the active layer 130 by means of in situ doping, and to pattern the doping channel layer as a channel area after the active layer 130 is patterned to form the active pillars 132.

In the embodiments according to the present invention, it is further possible to form a second doping area above the channel area via ion implantation; alternatively, a second doping layer is formed via in situ doping at a corresponding position during the process of forming the active layer 130, so that the second doping layer is patterned as the second doping area after the active layer 130 is patterned to form active pillars 132.

In other embodiments, it is also possible to not dope the active line to form the first doping area 1311 in the aforementioned process, but to form the first doping area at the bottom of the active pillars 132 via diffusion process or ion implantation of the doping transition layer after the active pillars 132 are formed in this step.

Figure 10:
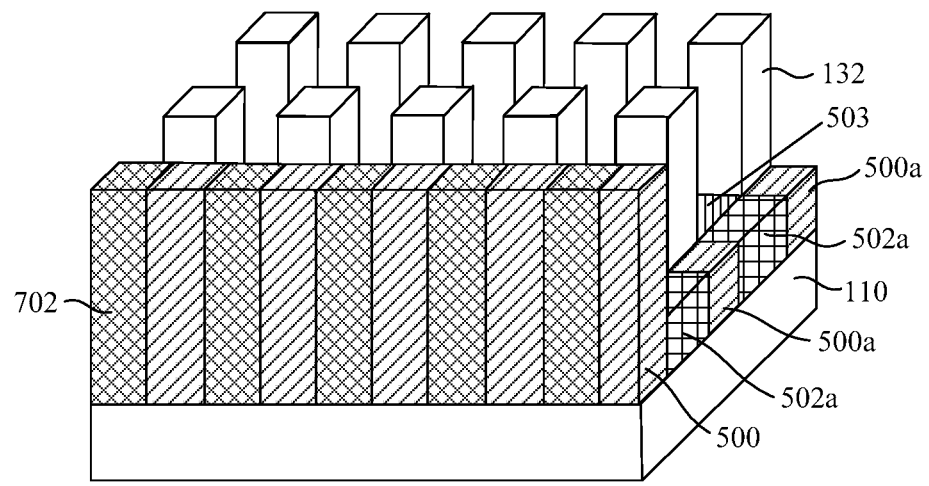

Referring to FIG. 10, the first separation layer 500 and the separation medium layer 502 are back-etched to expose the active pillars 132 of a certain height.

Before the first separation layer 500 and the separation medium layer 502 are back-etched, the claimed method further includes filling a separation medium material in the openings between adjacent active pillars 132, simultaneously back-etching the first separation layer 500, the separation medium layer 502 and the separation medium material, respectively forming back-etched first separation layer 500a, separation medium layer 502a and separation medium layer 503, with height corresponding to that of the first doping area 1311. In this embodiment, the surfaces of the back-etched first separation layer 500a, separation medium layer 502a and separation medium layer 503 are flush with the top of the first doping area 1311. In other embodiments, the surfaces of the first separation layer 500a, separation medium layer 502a and separation medium layer 503 can be slightly lower or higher than the boundary of the top of the first doping area 1311, thus exposing the regions of the active pillars 132 above the first doping area 1311.

During the process of back-etching the first separation layer 500, part of the first separation layer 500 between the bit-line connection line 702 and an adjacent bit-line connection line 702 can be covered by mask, to avoid etching thereof, and prevent damage to the bit-line connection line 702.

In other embodiments, the first separation layers 500 at various positions can all be back-etched.

Figure 11:
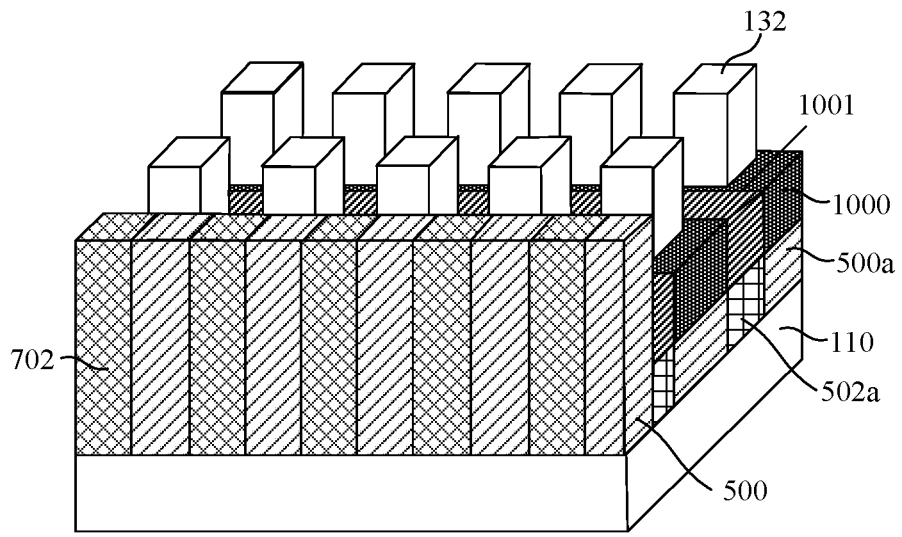

Referring to FIG. 11, a gate medium layer and a gate electrode layer are sequentially formed on the back-etched first separation layer 500a, separation medium layer 502a, separation medium layer 503 and exposed active pillar 132; the gate medium layer and the gate electrode layer are patterned to form a gate structure 1000 that surrounds the channel area of the active pillar.

The gate medium layer can be of such a gate medium material as silicon oxide, silicon oxynitride, hafnium oxide, alumina; the material of the gate electrode layer can be such a conductive material as polysilicon, tungsten or aluminum. The gate medium layer and gate electrode layer covering the structure shown in FIG. 10 can be sequentially formed by deposition technique; the gate medium layer and gate electrode layer are subsequently patterned via etching technique to form the gate structure 1000. The gate structure 1000 surrounds the channel area of the active pillars 132. The gate structure 1000 includes a gate medium layer and a gate electrode that covers the gate medium layer. In FIG. 11 is merely shown the gate electrode inside the gate structure 1000.

In this embodiment, gate electrodes of gate structures 1000 on active pillars 132 arranged on the same straight line along the second direction (direction x) are connected to form a wordline.

In other embodiments, gate structures 1000 on various active pillars 132 can also be independent of one another.

In order to electrically separate the various gate structures 1000, after the gate structures 1000 are formed, the method further includes filling a separation medium layer 1001 in between adjacent gate structures 1000. In other embodiments, the separation medium layer 1001 further covers the gate structure 1000 and the second doping area 1321.

Figure 12:
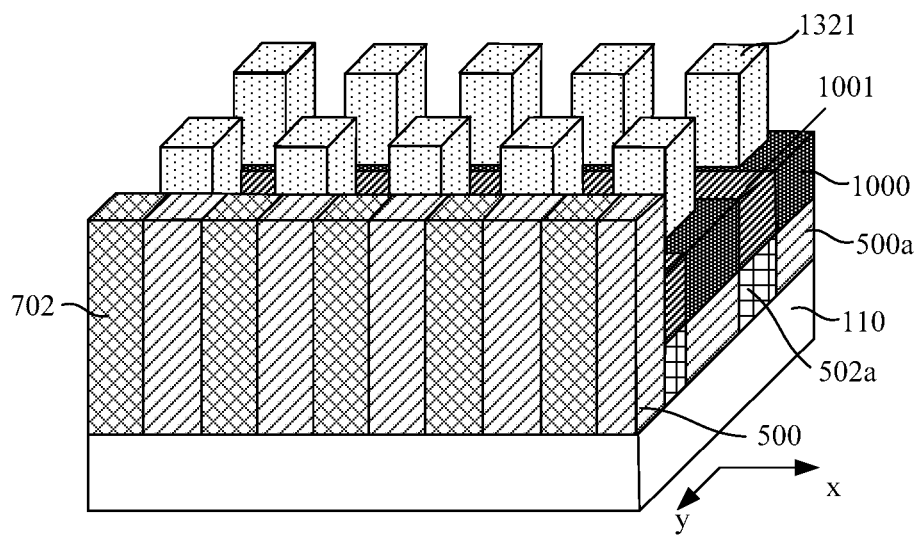

Referring to FIG. 12, after the gate structure 1000 is formed, ion implantation is performed on the top portion of the active pillar 132 to form the second doping area 1321.

The doping type of the second doping area 1321 is identical with the doping type of the first doping area 1311, the second doping area 1321 and the first doping area 1311 respectively serve as the source electrode or drain electrode of the vertical transistor. In other embodiments, the second doping area 1321 can also be formed by proper in situ doping, diffusion or implantation in the foregoing steps, to which no repetition is made in this context.

Figure 13A:
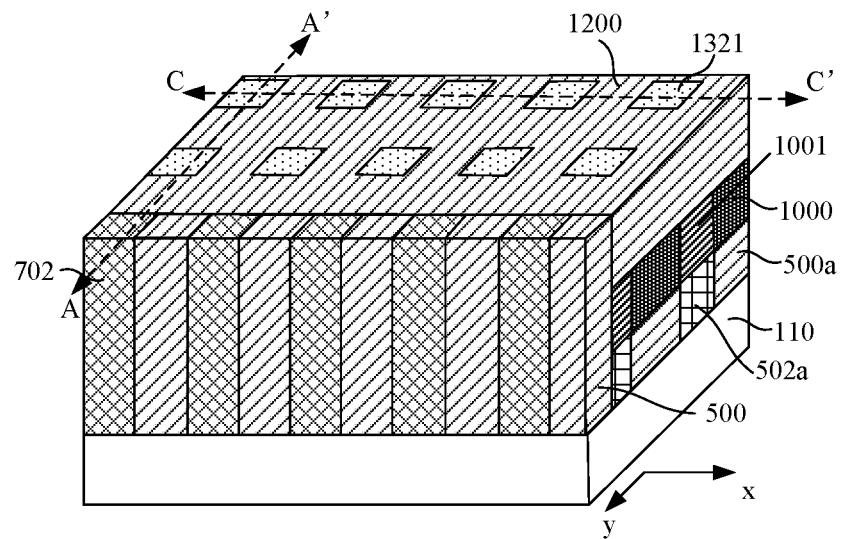
Figure 13B:
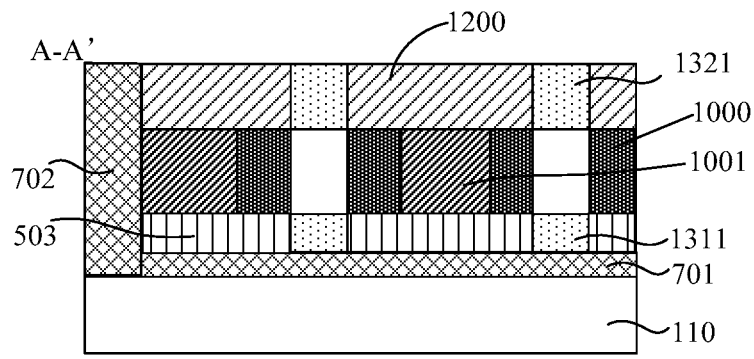
Figure 13C:
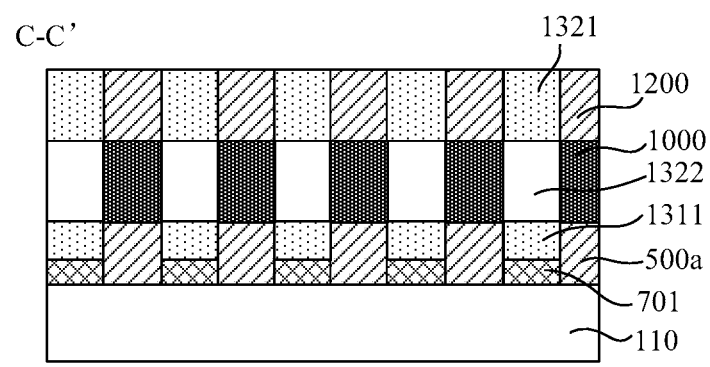

Referring to FIGS. 13A through 13C, a second separation layer 1200 is formed to cover the gate structure 1000 and the second doping area 1321; the second separation layer 1200 exposes top surfaces of the bit-line connection line 702 and the second doping area 1321. FIG. 13B is a diagram cut along secant line A-A' in FIG. 13A, and FIG. 13C is a diagram cut along secant line C-C' in FIG. 13A.

The material of the second separation layer 1200 can be such an insulating medium material as silica or silicon oxynitride. Together with the first separation layers 500, 500a and separation medium layers 502a, 1001, the second separation layer 1200 serves as a separation layer among the vertical transistors, and provides a plane surface for other semiconductor structures or material layers formed over the vertical transistors.

The claimed forming method forms the vertical transistor on the substrate, and forms the embedded bit line between the first doping area at the bottom of the vertical transistor and the substrate, thus reducing the area of the transistor, and solving the problem as how to send bit line signals to the vertical transistor at the same time.

In other embodiments, it is also possible to pattern the active line 131 as shown in FIG. 4, and form the bit line after forming the active pillar and subsequently removing the sacrificial layer.

Figure 14:
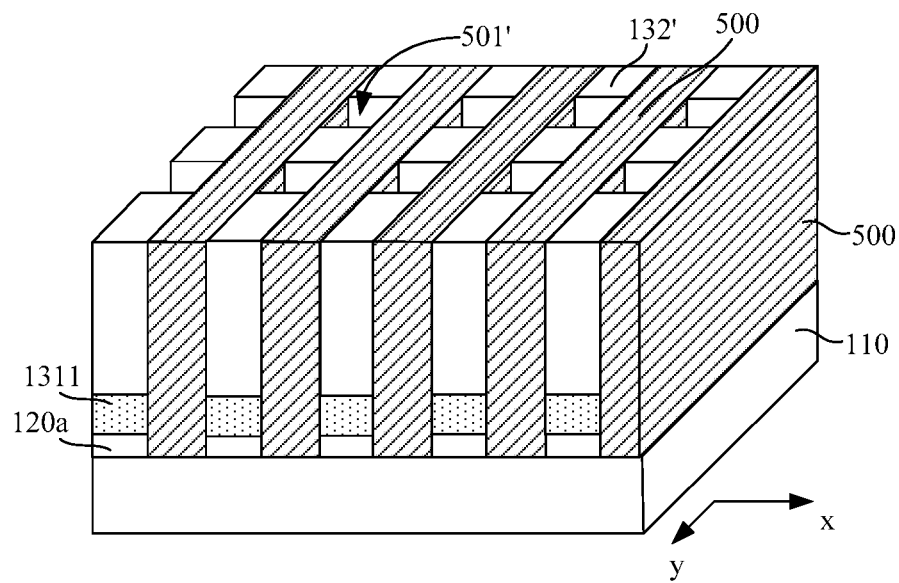
FIGS. 14 to 15 are schematic diagrams illustrating the process of forming the semiconductor according to an embodiment of the present invention.

Referring to FIG. 14, in which is shown another embodiment on the basis of FIG. 4, the active lines 131 are patterned to form openings 501'. After first separation layers 500 filling the space among the active lines 131 are formed on the substrate, the active lines 131 are patterned to form plural active pillars 132' and plural openings 501', whose sidewalls expose the sacrificial layer 20a.

Figure 15:
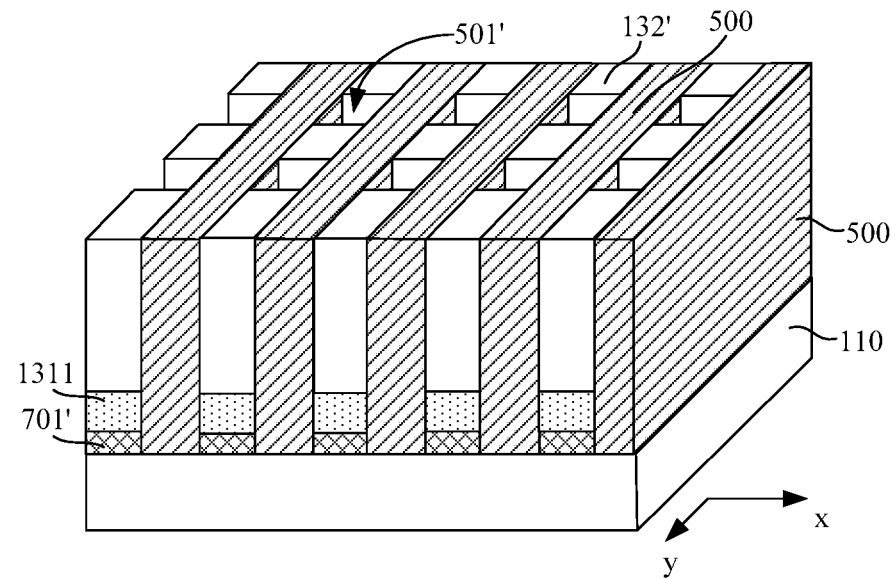

Referring to FIG. 15, the sacrificial layer 20a is removed along the openings 501', and space is formed between bottoms of the active pillars 132' and the substrate 110; a conductive material is filled in the space to form the bit line 701' extending along a first direction. In the process of forming the bit line 701', the conductive material would fill in the openings 501'; a certain thickness of the conductive material in the openings 501' can be removed by etching technique, while a certain thickness of the conductive material can be retained at the bottoms of the openings 501', so as to form continuous bit lines 701' at bottoms of active pillars 132' arranged on the same straight line along the first direction.

In other embodiments, the openings 501' are also formed on the end portions of the active lines 131 at the same side, or the openings are formed on the end portions of the active lines 131 at the two sides; moreover, the openings 501' are formed on only one end portion of each active line 131, and the openings on the end portions at the same side are distributed at intervals, so as to reduce the density of the openings at local regions, and to enlarge the process window. During subsequent filling of conductive material to form the bit line, bit-line connection lines can be simultaneously formed in the openings at the end portion, and the bit-line connection lines are formed in the same and single processing step as the bit line, thus saving processing cost.

Steps shown in FIG. 8A and the steps thereafter can be employed to form the semiconductor structure as shown in FIG. 13A. As compared with FIG. 8A, due to change in the positions of the openings, the positions of the separation medium layers filling the openings are also changed, and persons skilled in the art may make adaptive adjustments to partial steps in the aforementioned embodiment according to actual requirements, while all such adjustments fall within the protection scope of the present application.

A embodiment of the present invention further provides a semiconductor structure.

Refer to FIGS. 13A through 13C, which are schematic diagrams illustrating the semiconductor structure according to an embodiment of the present invention.

The semiconductor structure includes a substrate 110, a vertical transistor on the substrate 110, and a bit line 701 connected to the bottom of the vertical transistor, and disposed between the bottom of the vertical transistor and the substrate 110. The semiconductor structure in this embodiment is shown in FIGS. 13A through 13C.

In other embodiments of the present invention, the semiconductor structure can be formed by the method recited in the above embodiment, and can also be formed by other methods. All semiconductor structures having vertical transistors and embedded bit lines disposed at the bottoms of the vertical transistors can serve as the semiconductor structure claimed to be protected by the present application.

In this embodiment, the vertical transistor comprises, sequentially in the direction upward from the substrate 110, a first doping area 1311, a channel area 1322, a second doping area 1321, and a gate structure 1000 disposed to surround the channel area 1322.

A plurality of the vertical transistors is formed on the semiconductor structure and distributed in an array along a first direction (direction y) and a second direction (direction x), the first doping areas 1311 on the bottoms of the vertical transistors arranged on the same straight line along the first direction are connected to the same bit line 701, and the gate structures 1000 of the vertical transistors arranged on the same straight line along the second direction are connected to one another.

The semiconductor structure further comprises a separation layer formed between every two vertical transistors on the substrate 110; the separation layer includes bit lines 701 disposed on different straight lines, first separation layers 500a between first doping areas 1311, separation medium layers 503 between adjacent first doping areas 1311 disposed on the same straight line, separation medium layers 1001 between gate structures 1000 and disposed on the first separation layers 500a and separation medium layers 503, second separation layers 1200 disposed on the separation medium layers 1001 and between adjacent second doping areas 1321, and separation medium layers 502a disposed in the same layer as the first separation layers 500a.

The semiconductor structure further comprises an opening running through the active layer, in which opening is formed a bit-line connection line 702, whose bottom is connected to the bit line 701. In this embodiment, the bit-line connection lines 702 are disposed at two side edges of the transistor array; at every side of each row of transistors arranged along direction y are formed bit-line connection lines 702 at intervals and connected to bit lines 701 below this row of transistors, and adjacent bit-line connection lines 702 have therebetween a first separation layer 500. Specifically, the plural bit-line connection lines are respectively disposed on end portions of the plural bit lines in a one-by-one manner, and the bit-line connection lines are distributed at intervals at the end portions of the bit lines. The bit-line connection line and the bit line are formed in the same and single processing step.

In some embodiments, the first doping area 1311, the channel area 1322 and the second doping area 1321 of the vertical transistor are disposed within a single active pillar, which is a one-piece integrated structure. The first doping area 1311, the channel area 1322 and the second doping area 1321 are formed by doping. In other embodiments, it is also possible, during the process of forming the active layer 130 (refer to FIG. 1), to form a first doping layer, a doping channel layer and a second doping layer within the active layer 130 via in situ doping, and, after the active layer 130 is patterned to form the active pillar, to pattern the first doping layer as the first doping area, to pattern the doping channel layer as the channel area, and to pattern the second doping layer as the second doping area. In other embodiments, the channel area 1322 and the second doping area 1321 of the vertical transistor are formed in an epitaxial semiconductor pillar on the first doping area 1311; the semiconductor layer on which the channel area 1322 and the second doping area 1321 are disposed is not a one-piece structure with the epitaxial semiconductor pillar, as they are separately formed.

Doping of ions in the first doping area 1311 and/or the second doping area 1321 is effected via diffusion or ion implantation.

Embodiments of the present invention further provide a memory and its forming method.

First is provided a semiconductor structure that comprises a substrate, a vertical transistor on the substrate, and a bit line connected to the bottom of the vertical transistor, and disposed between the bottom of the vertical transistor and the substrate. In this embodiment, the semiconductor structure is as shown in FIGS. 13A through 13C. The semiconductor structure can be formed by the method recited in the above embodiment, and can also be formed by other methods. All semiconductor structures having vertical transistors and embedded bit lines disposed at the bottoms of the vertical transistors can serve as the semiconductor structure claimed to be protected by the present application.

Figure 16:
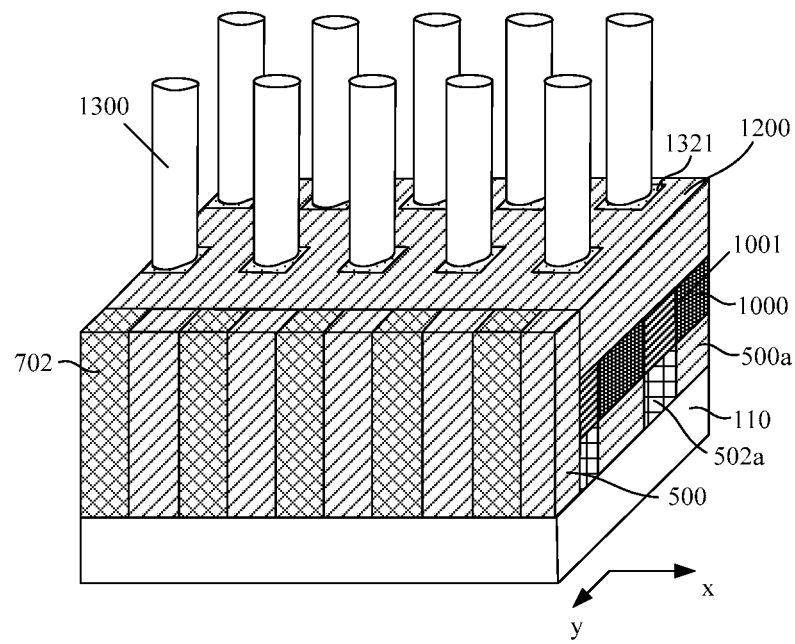
FIG. 16 is a schematic diagram illustrating the memory according to an embodiment of the present invention.

Referring to FIG. 16, storage cells 1300 are formed above the vertical transistor, and the storage cells 1300 are electrically connected to the second doping area 1321 of the vertical transistor.

In an embodiment, the memory is a DRAM memory, and the storage cell 1300 is a capacitor that includes an upper electrode, a lower electrode, and a capacitive medium layer disposed between the upper and lower electrodes. The capacitor can be structured as a planar capacitor, a pillar capacitor, etc., as persons skilled in the art may base on requirement to select a properly structured capacitor as the storage cell. In FIG. 16, the storage cell 1300 is merely illustrated by way of an example, and does not represent the actual structure of the capacitor. In this embodiment, the second doping area 1321 of each transistor is connected to a storage cell, constituting a 1T1C storage structure. The storage cell may comprise one capacitor, or two or more parallel capacitors.

In other embodiments, in order to reduce the connection resistance between the second doping area 1321 and the storage cell 1300, it is also possible to form a metal contact layer on the second doping area 1321, and then to form the storage cell on the metal contact layer.

The storage cell 1300 is formed in a medium layer (not shown in the Figure), and it is also possible to form in the medium layer a structure interconnecting the bit-line connection line 701 and the gate structure 1000, for connecting the bit line and the word line to external circuits.

In other embodiments of the present invention, the storage cell may be anyone of a magnetic storage cell, a ferroelectric storage cell, a phase-changing storage cell, or a resistive storage cell.

Figure 17:
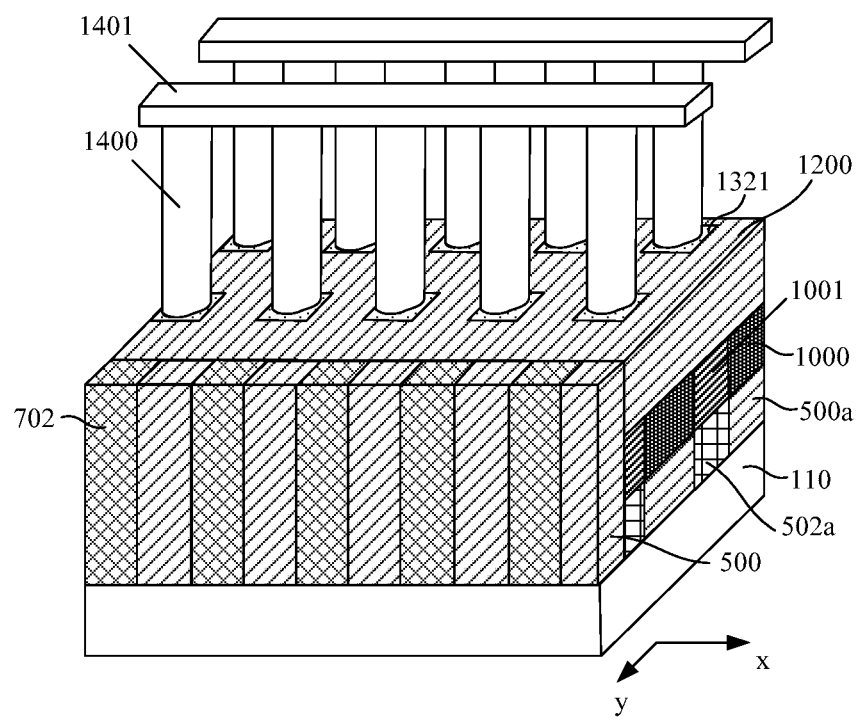
FIG. 17 is a schematic diagram illustrating the memory according to an embodiment of the present invention.

Refer to FIG. 17, which is schematic diagram illustrating the memory according to an embodiment of the present invention.

The memory is an FeRAM memory, and an electrically connected ferroelectric storage cell 1400 is formed above the second doping area 1321 of the vertical transistor of the semiconductor structure shown in FIG. 13A.

The ferroelectric storage cell includes a lower electrode connected to the second doping area 1321, an upper electrode disposed above the lower electrode, and a ferroelectric capacitor disposed between the upper and lower electrodes and made of a ferroelectric material layer. The material of the ferroelectric material layer can be PZT (lead thiocyanate zirconate-titanate) or SBT (barium strontium titanate). The ferroelectric storage cell 1400 in FIG. 17 is merely illustrated by way of an example, and does not represent the actual structure of the ferroelectric storage cell. Persons skilled in the art should be able to base on actual requirement to form the ferroelectric storage cell 1400 of a corresponding structure, to which no restriction is made in this context.

As for the ferroelectric storage cell 1400, it is further required to form a board line 1401 connected to the upper electrode above the ferroelectric storage cell 1400. In this embodiment, ferroelectric storage cells arranged along the second direction (direction x) on the same straight line are electrically connected to the same and single board line 1401, and the ferroelectric storage cells 1400 can be two-directionally input with voltage through the board line 1401 and the vertical transistors below, thereby making use of the performance of the ferroelectric material layer to perform data storage.

In other embodiments, it is also possible to form a magnetic storage cell above the second doping area 1321 of the vertical transistor; the magnetic storage cell comprises a magnetic tunnel junction that includes a fixation layer, a free layer, and a medium layer sandwiched between the fixation layer and the free layer. The fixation layer is connected to the second doping area 1321.

In other embodiments, it is further possible to form the storage cell of other structures or types, so as to form a corresponding memory.

By the aforementioned memory and its forming method, the vertical transistor is employed as a control transistor connected to the storage cell, and the embedded bit line is connected to the control transistor, whereby it is made possible to enhance the storage density of the memory.

The foregoing description is merely directed to embodiments preferred by the present invention; as should be pointed out, persons ordinarily skilled in the art may make various improvements and modifications without departing from the principle of the present invention, and all such improvements and modifications should be regarded to fall within the protection scope of the present invention.

The invention claimed is:

1. A method of forming a semiconductor structure, comprising:
   providing a substrate, on which are formed a sacrificial layer and an active layer on the sacrificial layer;
   patterning the active layer, forming an opening that exposes the sacrificial layer;
   removing the sacrificial layer by means of the opening; and
   forming a bit line at partial position of the sacrificial layer.

2. The method of forming a semiconductor structure according to claim 1, further comprising:
   patterning the active layer to form an active pillar, and forming the bit line between the bottom of the active pillar and the substrate.

3. The method of forming a semiconductor structure according to claim 2, further comprising:
   forming a first doping area, a channel area and a second doping area sequentially upward from the bottom of the active pillar, and forming a gate structure that surrounds the channel area.

4. The method of forming a semiconductor structure according to claim 3, wherein the method of forming the first doping area, the channel area and the second doping area comprises:
   employing in situ doping technique to dope the active layer in the process of forming the active layer by employing epitaxial growth technique, and to sequentially form a first doping layer, a channel doping layer and a second doping layer; and
   after patterning the active layer to form the active pillar, respectively patterning the first doping layer, the channel doping layer and the second doping layer as the first doping area, the channel area and the second doping area disposed sequentially upward from the bottom of the active pillar.

5. The method of forming a semiconductor structure according to claim 3, wherein the method of forming the first doping area comprises:

after forming the active pillars, forming a transition layer having doping elements on the substrate between adjacent active pillars; and diffusing, by a diffusion process, at least partial doping elements in the transition layer into the active pillar to form the first doping area.

6. The method of forming a semiconductor structure according to claim 3, wherein the method of forming the first doping area and the second doping area comprises:

conducting ion implantation at the bottom portion of the active pillar to form the first doping area disposed at the bottom of the active pillar; and conducting ion implantation at the top portion of the active pillar to form the second doping area disposed at the top of the active pillar.

7. The method of forming a semiconductor structure according to claim 2, wherein patterning the active layer to form the active pillar; the method of forming the bit line between the bottom of the active pillar and the substrate further comprising:

etching the active layer and the sacrificial layer to form active lines extending along a first direction;

forming a first separation layer that fills the space between the active lines; patterning the active lines to form plural active pillars and plural openings, which openings expose the sacrificial layer;

removing the sacrificial layer by means of the openings, and forming space between the bottom of the active pillar and the substrate; and filling conductive material in the space, and forming the bit line extending along the first direction.

8. The method of forming a semiconductor structure according to claim 7, further comprising:

forming an opening at the end portion of the active line; and filling conductive material in the opening to form a bit-line connection line, whose bottom is connected to the bit line.

9. The method of forming a semiconductor structure according to claim 8, wherein the bit-line connection line and the bit line are formed in the same and single processing step.

10. The method of forming a semiconductor structure according to claim 7, further comprising:

back-etching the first separation layer to expose the active pillar of a partial height; sequentially forming a gate medium layer and a gate electrode layer on the back-etched, exposed active pillar; and patterning the gate medium layer and the gate electrode layer to form a gate structure that surrounds the channel area of the active pillar, and to expose the top portion of the active pillar.

11. The method of forming a semiconductor structure according to claim 2, wherein patterning the active layer to form the active pillar; the method of forming the bit line between the bottom of the active pillar and the substrate further comprising:

etching the active layer and the sacrificial layer to form active lines extending along a first direction;

forming a first separation layer that fills the space between the active lines; patterning the first separation layer, forming plural openings in the first separation layer, which openings expose the sacrificial layer; removing the sacrificial layer by means of the openings, and forming space between the bottom of the active line and the substrate; filling conductive material in the space, and forming the bit line extending along the first direction; and patterning the active lines, and forming active pillars extending in an array along the first direction and second direction.

* * * * *